(12) United States Patent
Allen et al.

(10) Patent No.: US 7,135,747 B2
(45) Date of Patent: Nov. 14, 2006

(54) SEMICONDUCTOR DEVICES HAVING THERMAL SPACERS

(75) Inventors: Scott Thomas Allen, Apex, NC (US); James William Milligan, Cary, NC (US)

(73) Assignee: Cree, Inc., Durham, NC (US)

( * ) Notice: Subject to any disclaimer, the term of this patent is extended or adjusted under 35 U.S.C. 154(b) by 40 days.

(21) Appl. No.: 10/786,962

(22) Filed: Feb. 25, 2004

(65) Prior Publication Data
US 2005/0184339 A1    Aug. 25, 2005

(51) Int. Cl.
*H01L 29/94* (2006.01)

(52) U.S. Cl. ............ 257/401; 257/287; 257/390; 257/E27.07

(58) Field of Classification Search .......... 257/266, 257/280, 287, 390, 401, E27.07
See application file for complete search history.

(56) References Cited

U.S. PATENT DOCUMENTS

| | | | |
|---|---|---|---|
| 4,523,106 A | 6/1985 | Tanizawa et al. ........... 307/303 |
| 4,589,007 A | 5/1986 | Kuboki et al. ............... 357/45 |
| 4,757,028 A | 7/1988 | Kondoh et al. | |
| 4,762,806 A | 8/1988 | Suzuki et al. | |
| 5,003,370 A | 3/1991 | Kashiwagi ................. 357/39 |
| 5,060,046 A | 10/1991 | Shintani .................... 357/45 |
| 5,270,554 A | 12/1993 | Palmour | |
| 5,760,428 A | 6/1998 | Colwell et al. ............ 257/206 |
| 5,777,354 A | 7/1998 | Cheung et al. ............ 257/202 |
| 5,852,318 A | 12/1998 | Chikamatsu et al. ...... 257/390 |
| 5,925,895 A | 7/1999 | Sriram et al. | |
| 5,977,574 A | 11/1999 | Schmitt et al. ............ 257/207 |
| 6,140,184 A * | 10/2000 | Dupuy et al. .............. 438/275 |
| 6,376,898 B1 | 4/2002 | Uda et al. .................. 257/566 |
| 6,521,923 B1 * | 2/2003 | D'Anna et al. ............ 257/288 |
| 6,534,857 B1 | 3/2003 | Morse ....................... 257/705 |
| 6,608,349 B1 | 8/2003 | Naem | |
| 2002/0093033 A1 | 7/2002 | Zommer et al. ........... 257/202 |

FOREIGN PATENT DOCUMENTS

EP          0 725 445       8/1996

OTHER PUBLICATIONS

International Search Report and Written Opinion of the International Searching Authority for application No. PCT/US2004/038894 mailed on Oct. 7, 2005.
U.S. Appl. No. 09/567,717, filed May 10, 2000.
U.S. Appl. No. 10/136,456, filed Oct. 24, 2001.
U.S. Appl. No. 10/304,272, filed Nov. 26, 2002.
U.S. Appl. No. 10/734,398, filed Dec. 12, 2003.

* cited by examiner

*Primary Examiner*—N. Drew Richards
(74) *Attorney, Agent, or Firm*—Myers Bigel Sibley & Sajovec, P.A.

(57) ABSTRACT

A high power, high frequency semiconductor device has a plurality of unit cells connected in parallel. The unit cells each having a controlling electrode and first and second controlled electrodes. A thermal spacer divides at least one of the unit cells into a first active portion and a second active portion, spaced apart from the first potion by the thermal spacer. The controlling electrode and the first and second controlled electrodes of the unit cell cross over the first thermal spacer.

29 Claims, 6 Drawing Sheets
(1 of 6 Drawing Sheet(s) Filed in Color)

SEMICONDUCTOR DEVICES HAVING THERMAL SPACERS

STATEMENT OF GOVERNMENT INTEREST

The present invention was developed with Government support under contract number N39997-99-C-3761 awarded by the United States Navy. The Government has certain rights in this invention.

FIELD OF THE INVENTION

The present invention relates to microelectronic devices and more particularly to high power semiconductor devices.

BACKGROUND OF THE INVENTION

Electrical circuits requiring high power handling capability (>20 watts) while operating at high frequencies such as radio frequencies (500 MHz), S-band (3 GHz) and X-band (10 GHz) have in recent years become more prevalent. Because of the increase in high power, high frequency circuits there has been a corresponding increase in demand for transistors which are capable of reliably operating at radio frequencies and above while still being capable of handling higher power loads.

To provide increased power handling capabilities, transistors with a larger effective area have been developed. However, as the area of a transistor increases, the transistor, typically, becomes less suitable for high frequency operations. One technique for increasing the area of a transistor while still providing for high frequency operations is to use a plurality of transistor cells that are connected in parallel. Such may be provided using a plurality of gate fingers, thus, the source to drain distance may be kept relatively small while still providing for increased power handling capability. Conventionally, when a plurality of parallel transistor cells are connected in parallel on a single chip, the cells are evenly spaced such that the gate-to-gate distance between adjacent cells (referred to herein as "pitch" or "gate pitch") is uniform.

When such multi-cell transistors are used in high frequency operations, they may generate a large amount of heat. As a device heats up, performance of the device typically degrades. Such degradation may be seen in gain, linearity and/or reliability. Thus, efforts have been made to keep junction temperatures of the transistors below a peak operating temperature. Typically, heatsinks and/or fans have been used to keep the devices cool so as to ensure proper function and reliability. However, cooling systems may be increase size, electrical consumption, costs and/or operating costs of systems employing such transistors.

With uniform pitch multi-cell transistors, the temperature of cells near the center of the array are typically greater than those of the cells at the periphery. This is generally the case because the cells at the periphery have a larger area and/or a greater thermal gradient to areas surrounding the cells. Thus, for example, adjacent cells near the center of the multi-cell array will each generate heat and thus, each side of the cells will be at an elevated temperature with respect to cells farther from the center. This results in a thermal profile that is roughly a bell curve with center junction temperatures being the hottest and with the outer most junctions having a substantially reduced operating temperature compared to the center junctions.

An uneven temperature distribution among the junctions of a device may reduce device linearity. For example, for a device with a plurality of evenly spaced gate fingers connected by a manifold, RF phasing errors may occur along both the gate manifold and the individual gate fingers as a result of differing gate resistance as a function of temperature. Conventionally, to address these issues the spacing between the gate fingers is widened and/or the length of the fingers are shortened and additional fingers added to achieve the same net active area. Both of these solutions may result in spreading the heat load generated in the center of the device over a wider area. These solutions also may result in a larger area for the multi-cell transistor that may reduce the number of die per wafer.

SUMMARY OF THE INVENTION

Embodiments of the present invention provide a high frequency, high power semiconductor device having a plurality of unit cells connected in parallel. The unit cells each having a controlling electrode and first and second controlled electrodes. A first thermal spacer divides at least one of the unit cells into a first active portion and a second active portion, spaced apart from the first potion by the thermal spacer. The controlling electrode and the first and second controlled electrodes of the unit cell are provided on the first thermal spacer.

In further embodiments of the present invention, a second thermal spacer divides the unit cell into a third active portion. The third active portion is spaced apart from the first and second active portions. The controlling electrode and the first and second controlled electrodes of the unit cell are also provided on the second thermal spacer.

In additional embodiments of the present invention, a third thermal spacer divides an adjacent unit cell into a first active portion and a second active portion. The controlling electrode and the first and second controlled electrodes of the adjacent unit cell are provided on the third thermal spacer. The third thermal spacer is offset from the first and second thermal spacers.

In yet other embodiments of the present invention, the first and second active portions of the unit cell include mesas and the first thermal spacer includes a region between the mesas. Furthermore, the first and/or second controlled electrodes of the unit cell may include an air bridge across the region between the mesas. The controlling electrode of the unit cell may be provided on sidewalls of the mesas and extend onto a floor of the region between the mesas. The mesas may include epitaxial layers on a substrate and the region between the mesas may include an exposed region of the substrate.

In further embodiments of the present invention, the first thermal spacer is provided by an electrically inactive implanted region and/or an insulator region between the first and second active portions of the unit cell. Furthermore, a cross-sectional area of the controlling electrode may be greater where the controlling electrode crosses the first thermal spacer than a cross-sectional area of the controlling electrode on the first and second active portions of the at least one unit cell. Also, the thermal spacer may provide a lower peak junction temperature than a corresponding unitary gate device for a particular set of operating conditions.

In particular embodiments of the present invention, the unit cells are a plurality of unit cells arranged in a linear array. Also, the controlling electrode may be a gate finger and the first and second controlled electrodes may be source and drain electrodes. The unit cells may be unit cells of a silicon carbide MESFET. The unit cells may also be unit cells of a GaN transistor.

In other embodiments of the present invention, a high power, high frequency field effect transistor includes a plurality of unit cells electrically connected in parallel. A plurality of gate electrodes of the unit cells are electrically connected in parallel. A plurality of source electrodes of the unit cells and a plurality of drain electrodes of the unit cells are also electrically connected in parallel. A plurality of thermal spacers divide corresponding ones of the plurality of unit cells into at least a first active portion and a second active portion. The gate electrodes, source electrodes and drain electrodes of the unit cells cross over the corresponding thermal spacers.

In certain embodiments of the present invention, the plurality of unit cells comprise a linear array of unit cells. The plurality of thermal spacers may provide a checkerboard pattern. The plurality of thermal spacers may be substantially uniform in size or may be non-uniform in size. The plurality of thermal spacers could also be aligned between adjacent unit cells.

In further embodiments of the present invention, the plurality of unit cells are a plurality of silicon carbide unit cells. The plurality of unit cells could also be a plurality of gallium nitride based unit cells.

In yet other embodiments of the present invention, the first and second active portions of the unit cells include mesas and the plurality of thermal spacers include regions between the mesas. Furthermore, the first and/or second controlled electrodes of the unit cells may include an air bridge across the corresponding regions between the mesas. The controlling electrodes of the unit cells may be provided on sidewalls of the mesas and extend onto a floor of the regions between the mesas. The mesas may include epitaxial layers on a substrate and the region between the mesas may include an exposed region of the substrate.

In further embodiments of the present invention, the thermal spacers are provided by an electrically inactive implanted region and/or an insulator region between the first and second active portions of the unit cells. Furthermore, a cross-sectional area of the controlling electrodes may be greater where the controlling electrodes cross the thermal spacers than a cross-sectional area of the controlling electrodes on the first and second active portions of the unit cells. Also, the thermal spacers may provide a lower peak junction temperature than a corresponding unitary gate device for a particular set of operating conditions.

DESCRIPTION OF THE DRAWINGS

The patent or application file contains at least one drawing executed in color. Copies of this patent or patent application publication with color drawing(s) will be provided by the Office upon request and payment of the necessary fee.

The advantages and features of the invention, and the manner in which the same are accomplished, will become more readily apparent upon consideration of the following detailed description of the invention taken in conjunction with the accompanying drawings, which illustrate exemplary embodiments, and wherein.

DETAILED DESCRIPTION

The present invention will now be described with reference to the Figures that illustrate various embodiment of the present invention. As illustrated in the Figures, the sizes of layers or regions are exaggerated for illustrative purposes and, thus, are provided to illustrate the general structures or the present invention. Furthermore, various aspects of the present invention are described with reference to a layer being formed on a substrate or other layer. As will be appreciated by those of skill in the art, references to a layer being formed on another layer or substrate contemplates that additional layers may intervene. References to a layer being formed on another layer or substrate without an intervening layer are described herein as being "directly" on the layer or substrate. Like numbers refer to like elements throughout. As used herein the term "and/or" includes any and all combinations of one or more of the associated listed items.

It will be understood that although the terms first and second may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first region, layer, or section discussed below could be termed a second region, layer, or section, and similarly, a second without departing from the teachings of the present invention.

Figure 1:
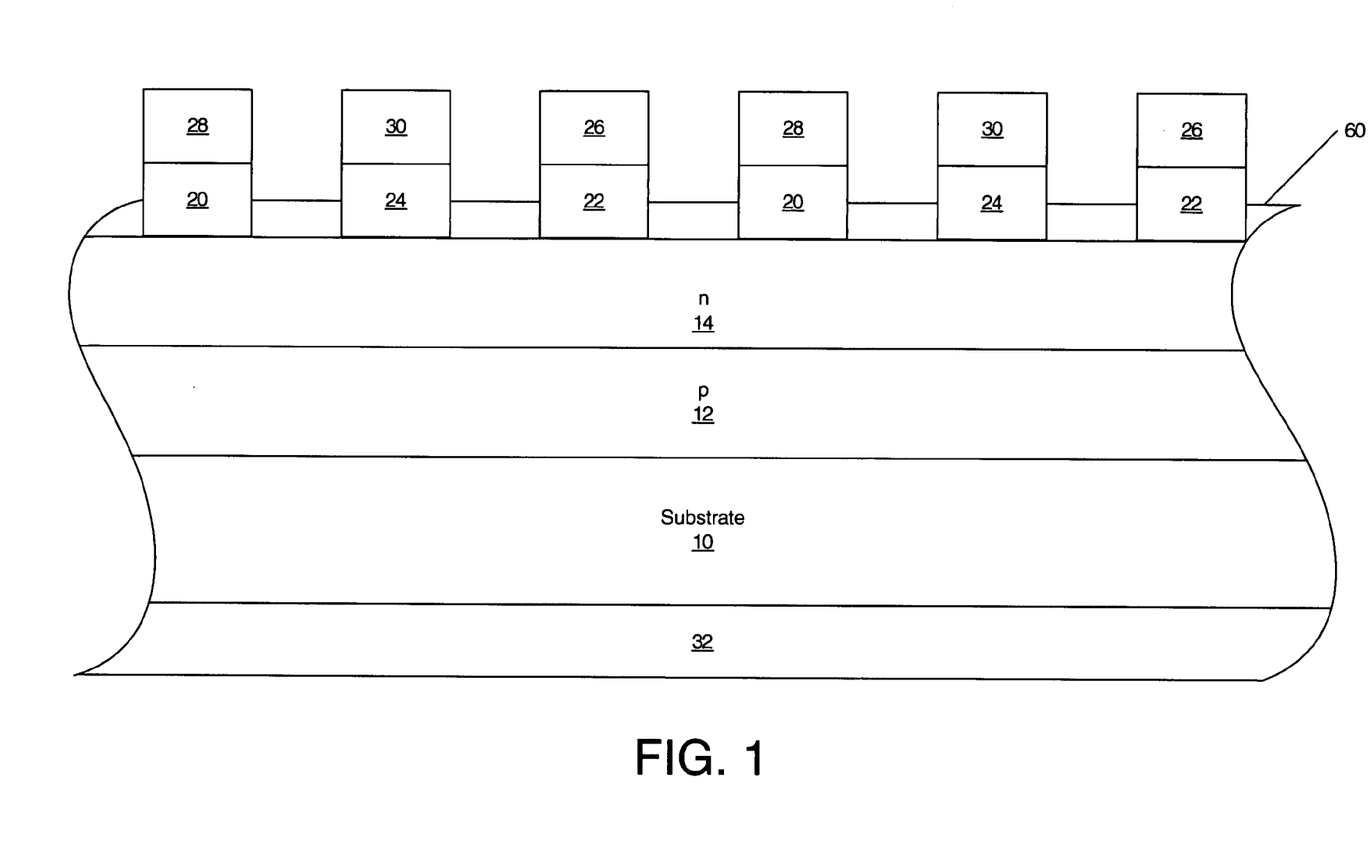
FIG. 1 is a cross-sectional view of a portion of a multi-cell transistor according to embodiments of the present invention.
Figure 2:
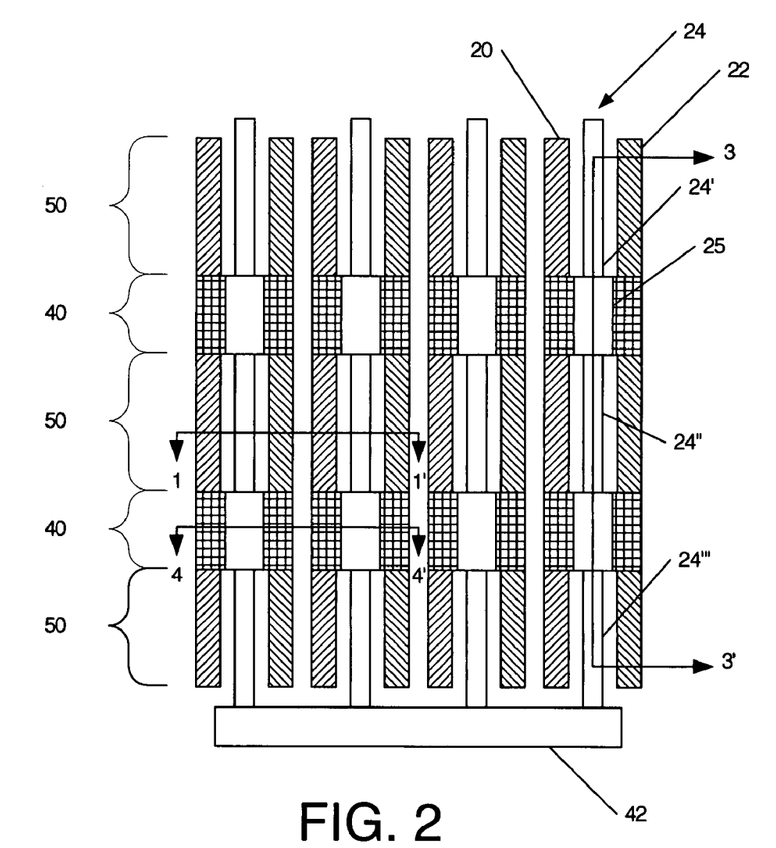
FIG. 2 is a plan view of a portion of a multi-cell transistor according to embodiments of the present invention.
Figure 3:
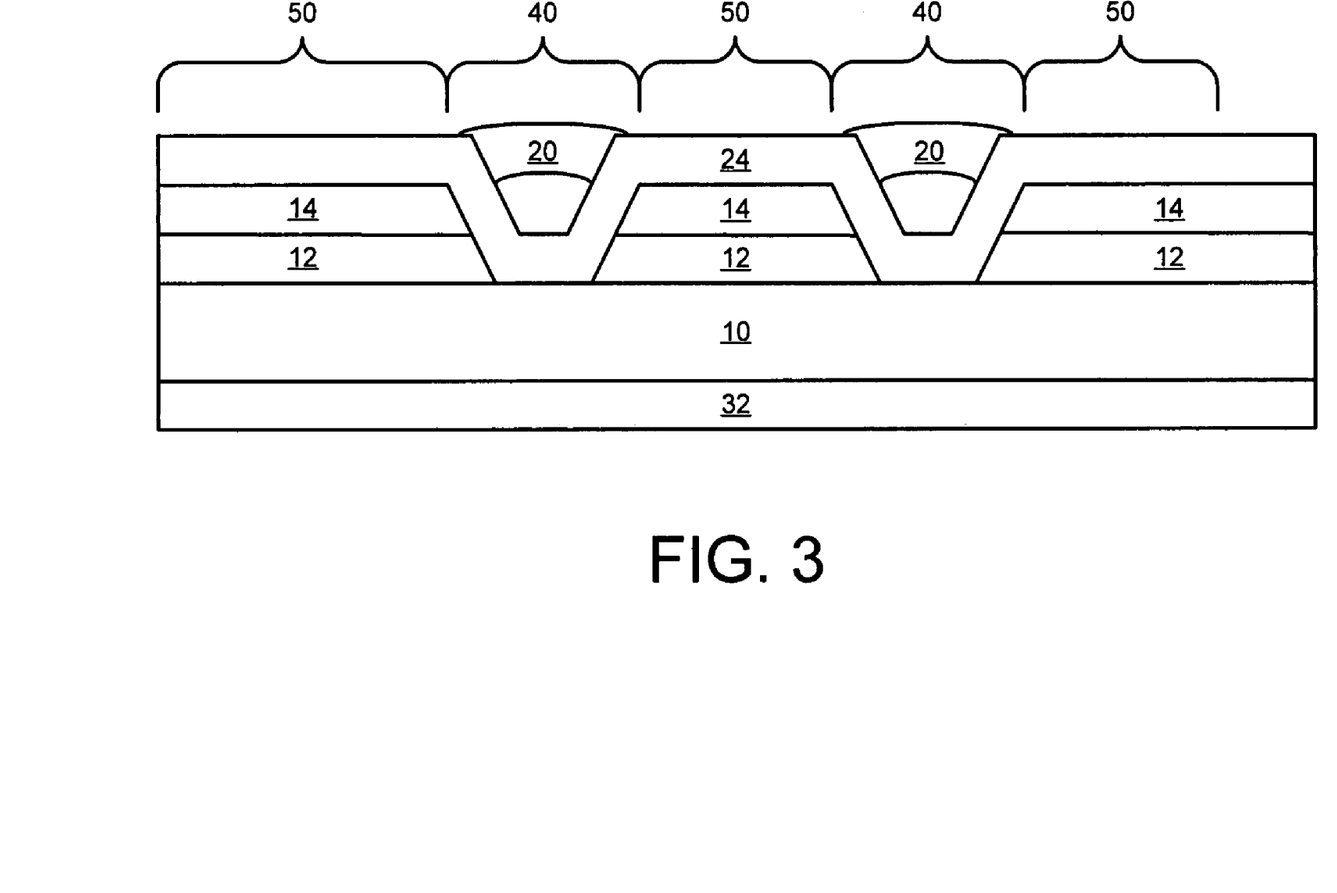
FIG. 3 is a cross-sectional view of a portion of a multi-cell transistor according to embodiments of the present invention.
Figure 4:
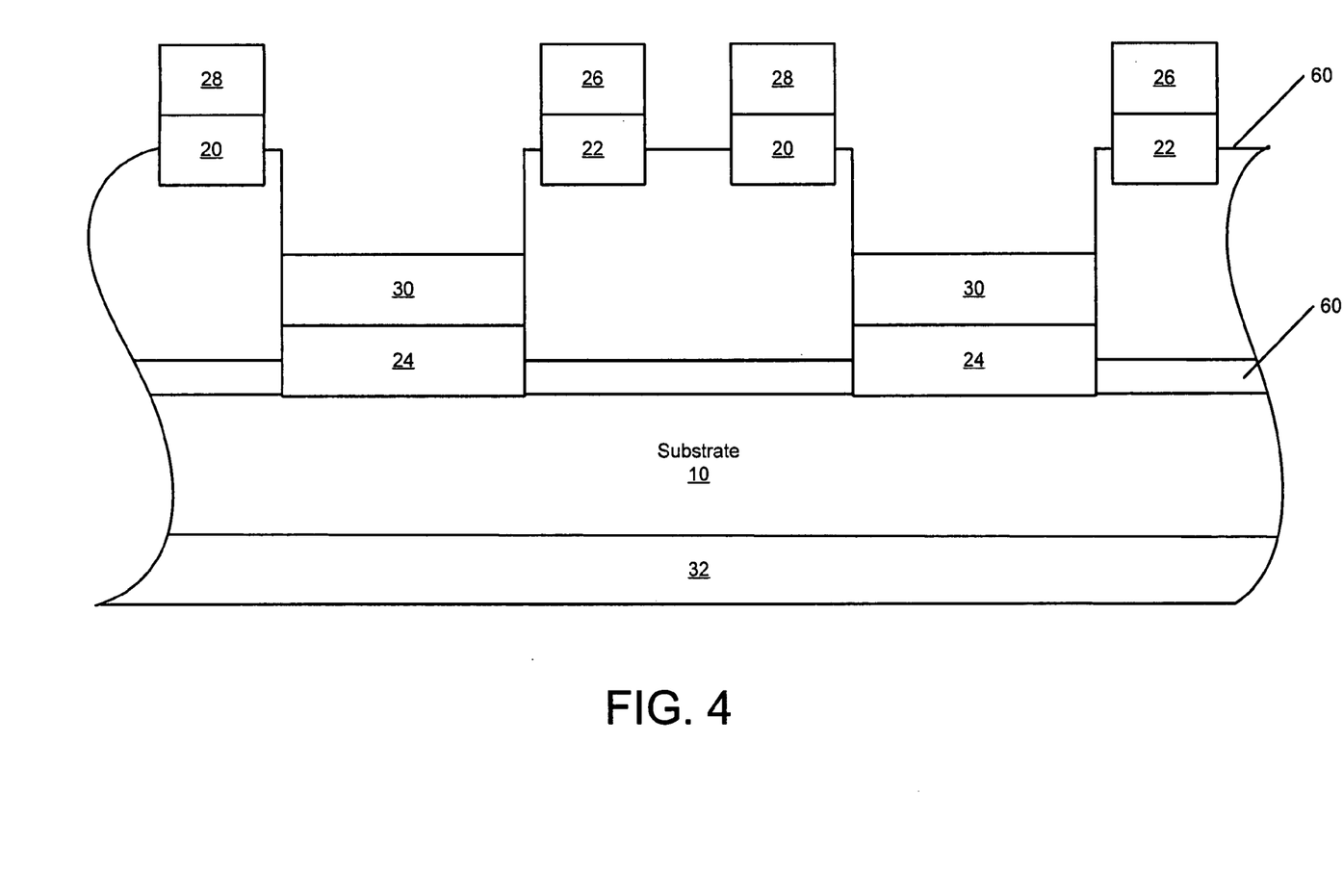
FIG. 4 is a cross-sectional view of a portion of a multi-cell transistor according to embodiments of the present invention.

Embodiments of the present invention will now be described with reference to FIGS. 1 through 3 where FIG. 2 is top view of exemplary devices according to embodiments of the present invention. FIG. 1 is a cross-sectional view of a portion of the devices of FIG. 2 taken along the lines 1–1'. FIG. 3 is a cross-sectional view of a portion of the devices of FIG. 2 taken along the lines 3–3'. FIG. 4 is a cross-sectional view of a portion of the devices of FIG. 2 taken along the lines 4–4'

FIG. 1 illustrates a portion of an exemplary transistor according to embodiments of the present invention. While embodiments of the present invention are illustrated—with reference to a SiC Metal Semiconductor Field Effect Transistor (MESFET), the present invention should not be construed as limited to such devices. Thus, embodiments of the present invention may include other transistor devices having a plurality of unit cells, such as Bipolar Junction Transistors. Thus, while embodiments of the present invention are discussed with reference to a non-uniform gate pitch, references to a "gate" herein refer to a controlling electrode of a semiconductor device. Embodiments of the present invention may be suitable for use in any semiconductor device where a more/relatively uniform junction temperature is desired and multiple unit cells of the device are present. Thus, for example, embodiments of the present invention may be suitable for use in non-silicon carbide devices, such as GaN, GaAs and/or Si devices. Accordingly, embodiments of the present invention may provide, for example, SiC MESFETs, SiC MESFET MMICs, SiC SITs, GaN HEMTs, GaN HEMT MMICs, Si LDMOS, GaAs MESFETs, GaAs MESFET MMICs, GaAs HEMTs, GaAs HEMT MMICs, GaAs pHEMTs and/or GaAs pHEMT MMICs.

As illustrated in FIG. 1, an exemplary portion of a MESFET incorporating embodiments of the present invention may include a first epitaxial layer 12 of p-type 30 conductivity is grown on a single crystal bulk silicon carbide substrate 10 of either p-type or n-type conductivity or semi-insulating. The first epitaxial layer of silicon carbide 12 is disposed between the substrate 10 and an n-type epitaxial layer 14. An optional metallization layer 32 may be formed on the opposite side of the substrate from the first epitaxial layer 12.

The first epitaxial layer 12 may be a p-type conductivity silicon carbide epitaxial layer, an undoped silicon carbide epitaxial layer or a very low doped n-type conductivity silicon carbide epitaxial layer. If a low doped silicon carbide epitaxial layer is utilized, then in certain embodiments, the doping concentration of the first epitaxial layer 12 is less than about $5 \times 10^{15}$ cm$^{-3}$. If an undoped or n-type first epitaxial layer 12 is utilized, then in certain embodiments, the substrate 10 is a semi-insulating silicon carbide substrate. If an undoped or n-type first epitaxial layer 12 is utilized, a high quality channel layer may be formed without the buffer layer having any significant electrical effect on the transistor.

Ohmic contacts 20 and 22 may be formed on the second epitaxial layer 14 and are spaced apart so as to provide a source contacts 20 and a drain contacts 22. A series of Schottky gate contacts 24, also referred to as gate fingers, are formed on the second epitaxial layer 14 between corresponding ones of the source contacts 20 and the drain contacts 22. As illustrated, optional metal overlayers 26, 28 and 30 are formed on the source and drain contacts 20 and 22 and the Schottky gate contacts 24. A passivation layer 60 may also be provided. As illustrated in FIG. 1, certain embodiments of the present invention provide a linear array of cells that are connected in parallel. Thus, the gate contacts 24 may be connected in parallel in a third dimension. In still other embodiments of the present invention a two dimensional array of cells may be provided.

While two gate fingers 24 are illustrated in FIG. 1, other numbers of gate fingers may be utilized. Furthermore, other MESFET or semiconductor device configurations may also be utilized. For example, devices such as those described in U.S. Pat. Nos. 4,762,806; 4,757,028, 5,270,554; and 5,925,895, the disclosures of which are incorporated herein as if set forth fully, may be utilized in embodiments of the present invention. Also devices such as those described in commonly assigned U.S. patent application Ser. No. 09/567,717, filed on May 10, 2000 entitled "SILICON CARBIDE METAL-SEMICONDUCTOR FIELD EFFECT TRANSISTORS AND METHODS OF FABRICATING SILICON CARBIDE METAL-SEMICONDUCTOR FIELD EFFECT TRANSISTORS"; Ser. No. 10/136,456, filed Oct. 24, 2001 entitled "DELTA DOPED SILICON CARBIDE METAL-SEMICONDUCTOR FIELD EFFECT TRANSISTORS AND METHODS OF FABRICATING DELTA DOPED SILICON CARBIDE METAL-SEMICONDUCTOR FIELD EFFECT TRANSISTORS HAVING A GATE DISPOSED IN A DOUBLE RECESS STRUCTURE"; and Ser. No. 10/304,272, filed Nov. 26, 2002 entitled "TRANSISTORS HAVING BURIED P-TYPE LAYERS BENEATH THE SOURCE REGION AND METHODS OF FABRICATING THE SAME," the disclosures of which are incorporated herein as if set forth fully, may be utilized in embodiments of the present invention. However, embodiments of the present invention are not limited to MESFETs but may be utilized with other devices having an array of controlling electrodes and, in certain embodiments, a linear array of controlling electrodes.

FIG. 2 is a top plan view of devices according to certain embodiments of the present invention. The device may be a SiC MESFET as is illustrated in FIG. 1. In FIG. 2, a plurality of gate fingers 24 are divided into first 24', second 24" and third portions 24''' by thermal spacers 40. While three portions of the gate fingers 24 are provided by the two thermal spacers 40 illustrate in FIG. 2, other numbers of thermal spacers 40 may also be provided. For example, a single thermal spacer may divide a gate finger into first and second portions. An electrically conductive manifold 42 is provided to connect the gate fingers 24 in parallel.

The thermal spacers 40 may be provided by providing an electrically inactive region interposed between the electrically active regions along a gate finger 24 such that the electrically inactive region does not generate heat. Such an electrically inactive region may, for example, be provided by removing all or part of one or more of the epitaxial layers 12 and 14 to expose the underlying layers and/or substrate 10. In particular embodiments of the present invention, the thermal spacers 40 comprise a portion of a semi-insulating silicon carbide substrate without the epitaxial layers 12 and 14. In other embodiments, the thermal spacers 40 comprise a portion of a semi-insulating silicon carbide substrate without the epitaxial layer 14 and with only a portion of the semiconductor layer 12. The thermal spacers 40 could also be provided by counterdoping, a local oxidation process or other such techniques to make the regions of the thermal spacers electrically inactive. For example, the division of the active region by a thermal spacer may be accomplished by an etched mesa, an ion implanted region, addition of a dielctric, or other mechanisms of providing electrical isolation. As used herein, the term "electrically inactive" refers to a region where a substantial current does not flow between controlled electrodes, if present, irrespective of a voltage or current applied to a controlling electrode. Thus, for example, in the thermal spacer regions 40 no current would flow from the source electrode 20 to the drain electrode 22 irrespective of the voltage of the gate finger 24 such that heat is not generated.

The thermal spacers 40 may provide an electrically inactive region with a length of each spacer, for example, of from about 50 μm to about 200 μm in length for silicon carbide. The particular length of the thermal spacer may depend on the gate width (i.e. the length of the gate finger). The number of thermal spacers per gate finger may be uniform or non-uniform. For example, for a 500 μm active area gate finger may be divided into three equal segments by two 100 μm thermal spacers. Alternatively, a 500 μm active area gate finger may be divided into two equal segments by a single 200 μm thermal spacer.

In the design of RF transistors, parasitic resistance, inductance and capacitance along each gate finger may be important. The length of each gate finger is, typically, limited by both thermal considerations and frequency response. As the desired operating frequency increases, typically the length of the gate fingers is reduced because reducing the series resistance and inductance along the gate finer increases the maximum frequency of operation ($f_{max}$) of the transistor. Therefore, in some applications, it may be desirable that the addition of the thermal spacer not have an adverse affect on the frequency performance of the transistor.

FIGS. 3 and 4 are a cross-sectional view of a portion of devices according to certain embodiments of the present invention. As seen in FIG. 3, the spacer region 40 is provided by removing portions of the epitaxial layers 12 and 14 to provide mesas 60 corresponding to the active areas of the device. The gate conductor 24 is provided on the mesa of the epitaxial layers 12 and 14 and continues down sidewalls of the mesa onto the substrate and to the next mesa. The source 20 and drain 22 conductors are air bridged between the mesas 60. Parasitic capacitances may be reduced and/or minimized by employing air bridges or dielectric crossovers to span the thermal spacer regions 40 with the source and drain electrodes 20 and 22. The gate electrode 24 could also be air bridged, but space constraints in the layout may prohibit this.

Parasitics may also be reduced and/or minimized as a result of the inclusion of the thermal spacers by flaring out the gate over the thermal spacers so that the increases in series resistance and inductance are minimized. Such a flared gate structure is illustrated in FIG. 2 as the regions 25 of the gate fingers 24. The gate finger 24 in the flared region 25 may have a width of from about 1 μm to about 20 μm. Thus, the regions 25 of the gate fingers 24 may have an increased width, which may provide an increased cross-sectional area over the portions of the gate fingers 24 in the active regions 50.

While embodiments of the present invention have been illustrated with reference to a non-uniform width of the gate conductor and an air bridge of the source and drain conductors, the present invention should not be construed as limited to such embodiments. For example, in certain embodiments of the present invention, the conductor of gate fingers may be substantially uniform in width. Furthermore, the conductors of the source and drain contacts may be in contact with an underlying region, such as the substrate 10 and/or an otherwise electrically inactive region of a thermal spacer. For example, the region between the mesas in FIG. 3 may be filled in with an insulator, such as an oxide, and the gate conductor and source and drain regions provided on the insulator.

Figure 6:
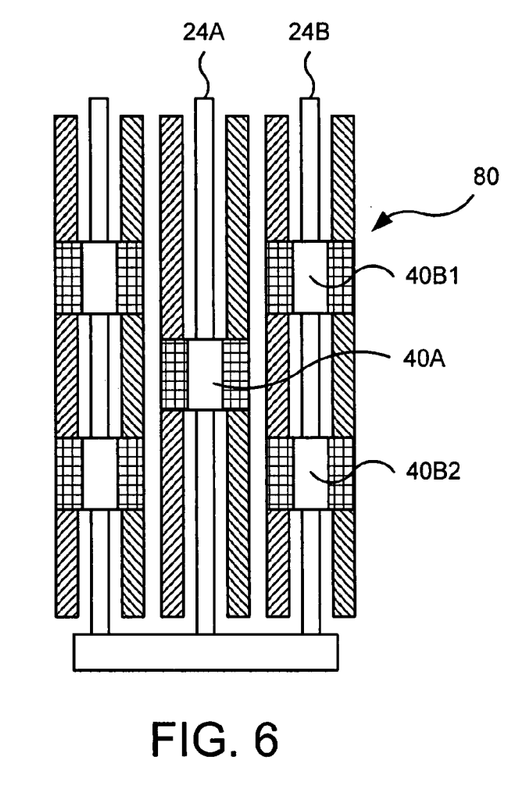
FIG. 6 is a plan view of a portion of a multi-cell transistor according to further embodiments of the present invention.

Furthermore, while the thermal spacers of FIGS. 1 through 4 are illustrated as having the same number of spacers in each gate finger, differing numbers of spacers may be provided in different fingers. For example, as illustrated in FIG. 6, a checkerboard pattern 80 of spacers may be provided where adjacent fingers having differing numbers of spacers. Thus, a first gate finger 24A may have a single spacer 40A at approximately the center of the finger 24A and an adjacent finger 24B may have two spacers 40B1, 40B2 centered at about ⅓ and ⅔ the length of the finger 24B. Such a checkerboard pattern 80 may be beneficial in providing a more uniform thermal profile as active portions of adjacent fingers 24A, 24B will be spaced apart from each other in two dimensions. The checkerboard pattern 80 may also reduce the mutual coupling between air bridges.

Furthermore, in addition to the incorporation of thermal spacers, the pitch between the gate fingers 24 may be non-uniform. For example, the pitch may vary from a small pitch to a larger pitch toward the center of the device. By increasing the pitch at the center of the device, the increased heat dissipation area may compensate for the decreased thermal gradient at the center of the device such that the junction temperature associated with the respective gate fingers may be moderated. A more uniform junction temperature may be provided for a decreased peak junction temperature which may result in improved reliability over a conventional uniform spaced device under the same operating conditions. Furthermore, the more uniform thermal profile may reduce impedance differences between the fingers and, thereby, improve linearity of an RF device. Thus, embodiments of the present invention may include a non-uniform gate pitch as described in U. S. patent application Ser. No. 10/734,398, entitled "NON-UNIFORM GATE PITCH SEMICONDUCTOR DEVICES," the disclosure of which is incorporated herein by reference as if set forth in its entirety.

EXAMPLES

The following examples are illustrative of certain embodiments of the present invention and shall not be construed as limiting the present invention.

Figure 5A:
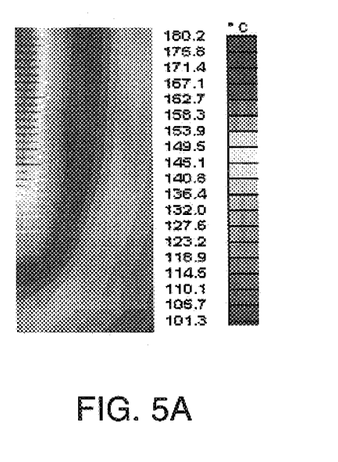
FIG. 5A is a thermal model of a unitary gate finger device.
Figure 5B:
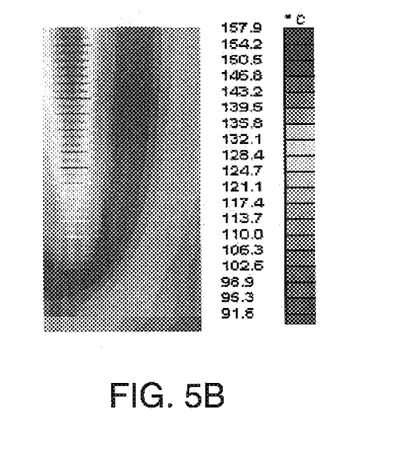
FIG. 5B is a thermal model of a divided gate finger device corresponding to the unitary gate finger device of FIG. 5A according to embodiments of the present invention.

A SiC MESFET MMIC with 30-mm of active gate periphery designed for continuous wave (CW) operation was thermally modeled for both a unitary gate finger device (FIG. 5A) and a divided gate finger device (FIG. 5B). For frequencies less than 4 GHz, each finger can be 500 μm long. The thermal model, including the effects of a CuW package and a AuSn solder attach shows that with the backside of the package maintained at a temperature of 90° C. The fingers were spaced 80 μm apart. The model indicated that the maximum junction is about 180° C. for a unitary gate finger device (FIG. 5A). The model also shows that by dividing each gate finger into two 250-μm segments and incorporating a 200 μm thermal spacer between them, the maximum junction temperature is reduced to about 158° C. (FIG. 5B). The maximum difference in temperature along each finger is also reduced by about 28% from about 39° C. to about 28° C., thereby potentially improving the linearity of the response. To achieve this same reduction in maximum junction temperature without including the thermal spacer would require increasing the gate pitch from 80 μm to 100 μm.

Potential benefits from the use of the thermal spacers can be seen by comparing the MMIC chip area for the two cases. As a specific example, assume that for the initial design with the 80-μm pitch, the MMIC chip was 5.0 mm×5.0 mm. By increasing the gate pitch to 100 μm, the MMIC chip is enlarged to 6.0 mm×5.0 mm, an increase in area of 20%. In contrast, by incorporating the 200 μm thermal spacer to achieve the same reduction in maximum junction temperature, the chip size becomes 5.0 mm×5.2 mm, an increase in area of only 4%.

In the drawings and specification, there have been disclosed typical embodiments of the invention and, although specific terms are employed, they are used in a generic and descriptive sense only and not for purposes of limitation, the scope of the invention being set forth in the following claims.

The invention claimed is:

1. A high power, high frequency semiconductor device comprising:
   a plurality of unit cells connected in parallel, the unit cells each having a controlling electrode and first and second controlled electrodes;
   a first thermal spacer dividing at least one of the unit cells into a first active portion and a second active portion, spaced apart from the first portion by the first thermal spacer, the controlling electrode and the first and second controlled electrodes of the at least one unit cell extending across the first thermal spacer;
   a second thermal spacer that divides the at least one unit cell into a third active portion, the third active portion being spaced apart from the first and second active portions and the controlling electrode and the first and second controlled electrodes of the at least one unit cell extending across the second thermal spacer; and a third thermal spacer dividing an adjacent unit cell into a first active portion and a second active portion, the controlling electrode and the first and second controlled electrodes of the adjacent unit cell extend across the third thermal spacer and wherein the third thermal spacer is offset from the first and second thermal spacers along a direction parallel to the controlling electrode.

2. The high power, high frequency semiconductor device of claim 1, wherein the first and second active portions of the at least one unit cell comprise mesas and wherein the thermal spacer comprises a region between the mesas.

3. The high power, high frequency semiconductor device of claim 2, wherein at least one of the first and/or second controlled electrodes of the at least one unit cell includes an air bridge across the region between the mesas.

4. The high power, high frequency semiconductor device of claim 2, wherein the controlling electrode of the at least one unit cell is provided on sidewalls of the mesas and extends onto a floor of the region between the mesas.

5. The high power, high frequency semiconductor device of claim 2, wherein the mesas comprise epitaxial layers on a substrate and wherein the region between the mesas comprises an exposed region of the substrate.

6. The high power, high frequency semiconductor device of claim 1, wherein the thermal spacer comprises an electrically inactive implanted region and/or an insulator region between the first and second active portions of the at least one unit cell.

7. A high power, high frequency semiconductor device comprising:
a plurality of unit cells connected in parallel, the unit cells each having a controlling electrode and first and second controlled electrodes; and
a thermal spacer dividing at least one of the unit cells into a first active portion and a second active portion, spaced apart from the first portion by the thermal spacer, the controlling electrode and the first and second controlled electrodes of the at least one unit cell extending across the thermal spacer, wherein a cross-sectional area of the controlling electrode is greater where the controlling electrode crosses the thermal spacer than a cross-sectional area of the controlling electrode on the first and second active portions of the at least one unit cell.

8. A high power, high frequency semiconductor device comprising:
a plurality of unit cells connected in parallel, the unit cells each having a controlling electrode and first and second controlled electrodes; and
a thermal spacer dividing at least one of the unit cells into a first active portion and a second active portion, spaced apart from the first portion by the thermal spacer, the controlling electrode and the first and second controlled electrodes of the at least one unit cell extending across the thermal spacer, wherein a width of the controlling electrode is greater where the controlling electrode crosses the thermal spacer than a width of the controlling electrode on the first and second active portions of the at least one unit cell.

9. The high power, high frequency semiconductor device of claim 1, wherein the thermal spacer is configured to provide a lower peak junction temperature than a corresponding unitary gate device for a particular set of operating conditions.

10. The high power, high frequency semiconductor device of claim 1, wherein the unit cells comprise a plurality of unit cells arranged in a linear array.

11. The high power, high frequency semiconductor device of claim 1, wherein the controlling electrode comprises a gate finger and the first and second controlled electrodes comprise source and drain electrodes.

12. The high power, high frequency semiconductor device of claim 11, wherein the unit cells comprise unit cells of a silicon carbide MESFET.

13. The high power, high frequency semiconductor device of claim 11, wherein the unit cells comprise unit cells of a GaN transistor.

14. The high power, high frequency semiconductor device of claim 1, wherein the thermal spacer comprises an electrically inactive region configured so as to not generate heat when the semiconductor device is in operation.

15. A high power, high frequency field effect transistor, comprising:
a plurality of unit cells electrically connected in parallel, each unit cell having a source region and a drain region;
a plurality of gate electrodes of the unit cells, the plurality of gate electrodes being electrically connected in parallel;
a plurality of source electrodes of the unit cells, the plurality of source electrodes being electrically connected in parallel;
a plurality of drain electrodes of the unit cells, the plurality of drain electrodes being electrically connected in parallel; and
a plurality of thermal spacers that divide corresponding ones of the plurality of unit cells into at least a first active portion and a second active portion and wherein the gate electrodes, source electrodes and drain electrodes of the unit cells cross over the corresponding thermal spacers,
wherein the plurality of thermal spacers are arranged in a checkerboard pattern.

16. The field effect transistor of claim 15, wherein the plurality of unit cells comprise a linear array of unit cells.

17. The field effect transistor of claim 15, wherein the plurality of thermal spacers are substantially uniform in size.

18. The field effect transistor of claim 15, wherein the plurality of thermal spacers are aligned between adjacent unit cells.

19. The field effect transistor of claim 15, wherein the plurality of unit cells comprise a plurality of silicon carbide unit cells.

20. The field effect transistor of claim 15, wherein the plurality of unit cells comprise a plurality of gallium nitride based unit cells.

21. The field effect transistor of claim 15, wherein the first and second active portions of the unit cells comprise mesas and wherein the thermal spacers comprise regions between the mesas.

22. The field effect transistor of claim 21, wherein a least one of the first and/or second controlled electrodes of the unit cells includes an air bridge across the region between the mesas.

23. The field effect transistor of claim 21, wherein the controlling electrodes of the unit cells are provided on sidewalls of the mesas and extend onto floors of the region between the mesas.

24. The field effect transistor of claim 21, wherein the mesas comprise epitaxial layers on a substrate and wherein the regions between the mesas comprise exposed regions of the substrate.

25. The field effect transistor of claim 15, wherein the thermal spacers comprise an electrically inactive implanted region and/or an insulator region between the first and second active portions of the unit cells.

26. A high power, high frequency field effect transistor, comprising:
   a plurality of unit cells electrically connected in parallel, each unit cell having a source region and a drain region;
   a plurality of gate electrodes of the unit cells, the plurality of gate electrodes being electrically connected in parallel;
   a plurality of source electrodes of the unit cells, the plurality of source electrodes being electrically connected in parallel;
   a plurality of drain electrodes of the unit cells, the plurality of drain electrodes being electrically connected in parallel; and
   a plurality of thermal spacers that divide corresponding ones of the plurality of unit cells into at least a first active portion and a second active portion and wherein the gate electrodes, source electrodes and drain electrodes of the unit cells cross over the corresponding thermal spacers,
   wherein a cross-sectional area of the gate electrodes is greater where the gate electrodes cross the thermal spacers than a cross-sectional area of the gate electrodes on the first and second active portions of the unit cells.

27. A high power, high frequency field effect transistor, comprising:
   a plurality of unit cells electrically connected in parallel, each unit cell having a source region and a drain region;
   a plurality of gate electrodes of the unit cells, the plurality of gate electrodes being electrically connected in parallel;
   a plurality of source electrodes of the unit cells, the plurality of source electrodes being electrically connected in parallel;
   a plurality of drain electrodes of the unit cells, the plurality of drain electrodes being electrically connected in parallel; and
   a plurality of thermal spacers that divide corresponding ones of the plurality of unit cells into at least a first active portion and a second active portion and wherein the gate electrodes, source electrodes and drain electrodes of the unit cells cross over the corresponding thermal spacers,
   wherein a width of the gate electrodes is greater where the gate electrodes cross the thermal spacers than a width of the gate electrodes on the first and second active portions of the unit cells.

28. The field effect transistor of claim 15, wherein the thermal spacers are configured to provide a lower peak junction temperature than a corresponding unitary gate device for a particular set of operating conditions.

29. The field effect transistor of claim 15, wherein the thermal spacers comprise an electrically inactive region so as to not generate heat when the field effect transistor is in operation.

* * * * *